United States Patent [19]

Fenk

[11] Patent Number: 4,635,003
[45] Date of Patent: Jan. 6, 1987

[54] OSCILLATOR MIXER CIRCUIT WITH REACTION-TREE COUPLING

[75] Inventor: Josef Fenk, Eching/Ottenburg, Fed. Rep. of Germany

[73] Assignee: Siemens Aktiengesellschaft, Berlin and Munich, Fed. Rep. of Germany

[21] Appl. No.: 742,087

[22] Filed: Jun. 6, 1985

[30] Foreign Application Priority Data

Jun. 7, 1984 [DE] Fed. Rep. of Germany ........ 3421278

[51] Int. Cl.[4] ............................................... H03C 3/00
[52] U.S. Cl. .................................... 332/16 R; 332/21; 331/74
[58] Field of Search ...................... 332/16 R, 16 T, 17, 332/31 R, 31 T, 9 R, 9 T, 10, 14, 21, 40; 455/42, 108, 110, 318, 319, 320; 358/23; 331/74, 75

[56] References Cited

U.S. PATENT DOCUMENTS

| | | |
|---|---|---|
| 3,688,214 | 8/1972 | Goldie .................................... 331/75 |
| 4,052,682 | 10/1977 | Wilcox ........................... 332/31 T X |
| 4,536,721 | 8/1985 | Charbonnier ...................... 331/74 X |

FOREIGN PATENT DOCUMENTS 0051179 5/1982 European Pat. Off. .
0073929 3/1983 European Pat. Off. .
2330201 5/1977 France .

OTHER PUBLICATIONS

*Electronics International*, vol. 54, Dec. 1981, pp. 76–78, Scott, B. et al., "Linear One-Chip Modulator Eases TV Circuit Design".
*Elektror*, vol. 9, Feb. 1983, No. 2, pp. 227–231, "VAM—Video/Audio Modulator".
*National Semiconductor IC specification* "LM2889 TV Video Modulator", Apr. '83.

*Primary Examiner*—Eugene R. Laroche
*Assistant Examiner*—D. Mis
*Attorney, Agent, or Firm*—Herbert L. Lerner; Laurence A. Greenberg

[57] ABSTRACT

An oscillator and mixer circuit of an integrated UHF/VHF modulator circuit includes a single active oscillator circuit to be connected to frequency-determining passive circuits for UHF and multichannel VHF operation, a single mixer part mixing an oscillator signal from the active oscillator circuit with a useful signal, and a reaction-free coupling connected between the single active oscillator circuit and the single mixer part.

15 Claims, 3 Drawing Figures

OSCILLATOR MIXER CIRCUIT WITH REACTION-TREE COUPLING

The invention relates to an oscillator-mixer circuit of an integrated UHF/VHF modulator circuit, including an active oscillator circuit operable for UHF and multichannel VHF operation by connecting it to frequency-determining passive circuits, and a mixer part for mixing an oscillator signal and a useful signal, such as video and/or an audio signal.

An integrated modulator module is known from the preliminary IC specification of the TV video modulator LM 2889 of the firm National Semiconductor, dated April 1983. The integrated circuit is suitable only for the VHF television band and uses two completely separate mixer and oscillating circuits for tuning to two television channels. The integrated module itself contains substantially active circuits which determine the oscillator frequency by wiring them to passive, hard-to-integrate elements, i.e. inductances, capacitors and resistors.

This integrated TV modulator requires a considerable amount of circuitry in the oscillator and mixer part, and even so, the insulation of the video and sound signal from the oscillator stage necessary for use in the UHF range, is not sufficient.

It is accordingly an object of the invention to provide an oscillator and mixer circuit which overcomes the hereinaforementioned disadvantages of the heretofore-known devices of this general type, which requires a small amount of circuitry, and which can be constructed for UHF as well as multichannel VHF operation by wiring the oscillator part to frequency-determining passive circuits.

With the foregoing and other objects in view there is provided, in accordance with the invention, an oscillator and mixer circuit arrangement of an integrated UHF/VHF modulator circuit, comprising a single active oscillator circuit to be connected to frequency-determining passive circuits for UHF and multi-channel VFH operation, a single mixer circuit mixing an oscillator signal from the active oscillator circuit with a useful signal, such as a video and/or audio signal, and a reaction-free coupling connected between the single active oscillator circuit and the single mixer circuit.

In accordance with another feature of the invention, the active oscillator circuit has an output, the mixer part has an input, and the reaction-free coupling is a buffer stage having an input capacitively coupled without reaction to the output of the active oscillator circuit, and an output connected to the input of the mixer part.

In accordance with an added feature of the invention, the capacitive reaction-free coupling is an integrated capacity device formed of a series circuit of an MOS capacity and a barrier layer capacity.

In accordance with an additional feature of the invention, the MOS capacity is formed of a semiconductor body containing an integrated circuit, an insulating passivating layer disposed on the semiconductor body as a dielectric, and a conductor run disposed on the insulating passivating layer; and the barrier layer capacity is formed by at least one pn-junction between a doped zone disposed in the semiconductor body of the integrated circuit and the semiconductor body.

In accordance with a further feature of the invention, there are provided terminals connected to the active oscillator circuit for the frequency-determining passive circuits, and output terminals connected to the mixer part by the capacity device described above.

In accordance with a concomitant feature of the invention, there is provided a high-resistance branch connecting the barrier layer capacity to a reference potential.

Other features which are considered as characteristic for the invention are set forth in the appended claims.

Although the invention is illustrated and described herein as embodied in an oscillator-mixer circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
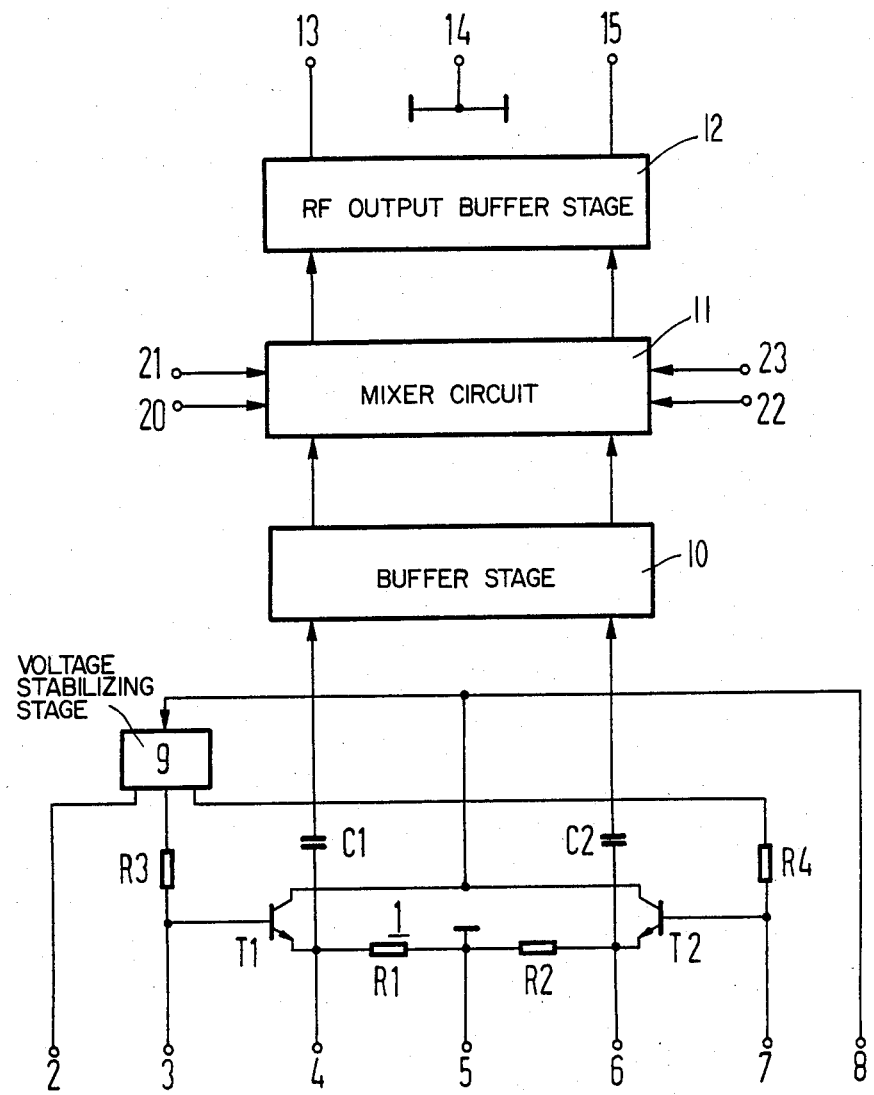
FIG. 1 is a schematic block and circuit diagram of an oscillator and mixer part of an integrated modulator module according to the invention.

Referring now to the figures of the drawings in detail and first, particularly, to FIG. 1 thereof, there is seen a block diagram of a circuit according to the invention, showing oscillator and mixer parts, with a terminal 8 which serves for connecting a positive supply voltage for an integrated modulator module which is brought to the input of a voltage-stabilizing stage 9. In the voltage stabilizing stage 9, a reference voltage is generated which can be taken off at a terminal 2 of the modulator module. The other two outputs of the voltage stabilizing stage 9, which is known in the prior art, are each connected through one of two resistors R3 and R4 to one of two nodes. One node is connected to a terminal 3 of the modulating module and to the base of a transistor T1 of the active oscillator part 1 and the other node is connected to a terminal 7 of the modulator module and to the base of a transistor T2 of the active oscillator part 1. The two collectors of the transistors T1 and T2 of the active oscillator part 1 are directly connected to each other and are connected through the terminal 8 of the modulator module to the positive supply voltage for the circuit. The emitter of the transistor T1 of the active oscillator part 1 of the module is connected to a terminal 4 and is also connected through a resistor R1 to a terminal 5 of the module, which at the same time carries the reference potential. The emitter of the transistor T2 of the active oscillator part 1 is connected to a terminal 6 of the integrated modulator and it is also connected through a resistor R2 to the terminal 5 carrying the reference potential for the circuit.

The terminals 3 and 4 as well as the terminals 7 and 6 of the integrated modulator module which are symmetrical to the terminal 5 carrying reference potential, form the inputs for the active oscillator part 1. External wiring to passive circuits forms tuned LC circuits in principle in connection with the active oscillator circuit 1, which have a defined oscillator frequency. The frequency-determining passive circuits connected to the terminals 3, 4 and 6, 7, repectively, may be symmetrically or asymmetrically configured with respect to the terminal 5 which carries the reference potential for the integrated circuit.

A completely symmetrical circuit of the oscillator parts is necessary especially for the UHF band in order to obtain the required values for cross-talk attenuation required for the integrated modulator circuit contained in a DIL (dual in line) casing. If a tuning diode is preferred with symmetrical wiring for the VHF-range, the oscillator frequency can be tuned to two channels of the VHF band, for instance, by means of the tuning diode.

On the other hand, the cross talk attenuation of the DIL casing is sufficiently large in the VHF range, so that completely symmetrical wiring is not necessary, but asymmetrical wiring is also possible. In particular, two separate single-clock oscillators can be formed by switching between the respective circuits connected to the input terminals 3, 4 and 7, 6 of the active oscillator part 1, so that tuning or switching diodes can be omitted. Advantageously, either the terminal 4 or the terminal 6 is connected through an associated resistor to the terminal 8 of the integrated module carrying the positive supply voltage, and either the terminal 3 of the terminal 7 is blocked from the supply voltage by at least one capacitor. If the terminal 4 is connected to the positive supply voltage, the oscillator inputs 6 and 7 of the integrated circuit are active, and if terminal 6 is connected to the positive supply voltage, the oscillator inputs 3 and 4 of the integrated circuit are active. By a suitable choice of the passive circuits associated with the terminals 3, 4 and 6, 7, respectively, the oscillator frequency can be tuned to one channel of the VHF band and the oscillation amplitude of the oscillator can be chosen so that the cross talk attenuation of the asymmetrical oscillator from outputs 13 and 15, yet to be described, is sufficiently large.

The outputs of this conventional oscillator structure are formed by the emitters of the transistors T1 and T2 of the active oscillator part 1 of the integrated modulator module, which couple the oscillator signal to a buffer stage 10 through coupling capacitors C1 and C2. The oscillator signal travels from this conventional buffer stage 10 to the input of a conventional mixer circuit 11, which has other input terminals 20, 21 and 22, 23, respectively, to which an audio and/or video signal can be applied. The mixed signal generated in the mixer 11 formed of the audio, video and oscillator signal, travels through a conventional radio-frequency output buffer stage 12 to the output terminals 13 and 15 of the integrated modulator module. The signal can be taken off between these terminals 13 and 15, respectively, and a terminal 14 carrying the reference potential of the modulator module.

The object of the invention is to keep the amount of circuitry small with only a single active oscillator circuit 1 and a single mixer 11, and to achieve the high cross talk attenuation required for UHF operation by a reaction-free coupling of the oscillator signal into the mixer 11. This object is met by the conventional buffer stage 10, which essentially contains a differential amplifier and preceding emitter followers that form the input and receive the output signal of the oscillator transistors T1 and T2 through the coupling capacitors C1 and C2; the output thereof is coupled to the mixer input. The oscillator transistors T1 and T2 are also used in the VHF band in symmetrical operation for driving the buffer stage 10 and the mixer circuit 11, respectively. In asymmetrical VHF operation, the coupling capacitors C1 and C2 make it possible to couple the oscillator signal into the buffer stage 10 which takes care of making the signal symmetrical for driving the mixer. Video and audio-frequency signals are sufficiently suppressed by the buffer stage 10 as well as by the capacitors C1 and C2 acting as a highpass filter, so that the transistors T1 and T2 which act as amplifiers in the active oscillator part 1 are subjected to minimal interference in the oscillator operation and the oscillator oscillates with high spectrum purity. The decoupling from the mixer 11 to the oscillator part 1 in the active signal path is sufficiently large in the circuit according to the invention. In order to assure high freedom of reaction from the audio or video signal to the oscillator through the parasitic path, such as is provided by the DIL casing and the common substrate, it is necessary to obtain capacity values of the parasitic substrate share of the coupling capacitors C1 and C2, that are as small as possible.

Figure 2:
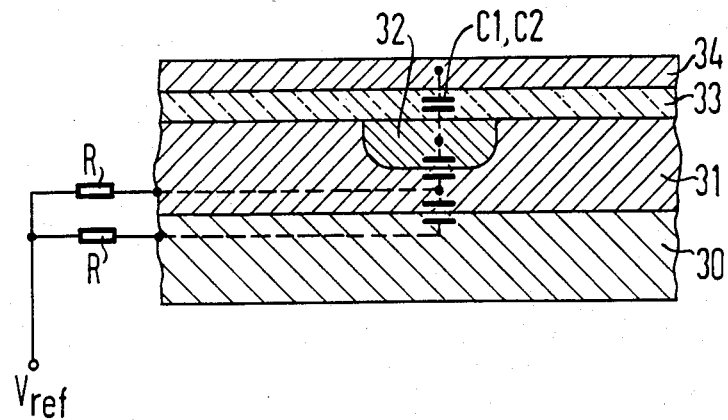
FIG. 2 is a partly schematic, fragmentary, diagrammatic, cross-sectional view of an embodiment of a coupling capacity disposed between the oscillator and the mixer part of the module.

FIG. 2 shows an embodiment of the construction of the coupling capacitors C1 and C2 according to the invention. An epitaxial layer 31 is applied to a substrate 30. The epitaxial layer 31 contains a highly conducting zone 32 which is obtained by diffusion or implantation. A layer 33 which serves as a dielectric and is formed of insulating and passivating material, such as $SiO_2$, is disposed on the epitaxial layer 31 and the high-conduction zone 32. A high-conduction layer 34 which may be formed of aluminum, is disposed on the layer 33. Neglecting fringe effects, one coupling capacity C1 or C2, respectively, is formed by the MOS capacity which is provided by the geometric dimension of the surface of the conducting zone facing the insulating layer 33 as one electrode, an area of the conducting layer 34 of equal size as the second electrode, and the dielectric of the insulating layer 33 in between.

Since the substrate 30 and the conducting zone 32 are of the same conduction or conductivity type, while the epitaxial layer 31 is of the other conduction or conductivity type, the structure of FIG. 2 according to the invention contains parasitic capacities at the barrier layers from the substrate 30 to the epitaxial layer 31 and from the epitaxial layer 31 to the conducting layer 32. According to the invention, the conducting layer 34 provided as a conductor run, is connected to the output of the transistor T1 and T2, respectively, of the oxcillator, and the high conduction zone 32 is connected to the input of the buffer stage 10. According to the invention, the substrate 30 and the epitaxial layer 31 are furthermore connected to the reference potential $V_{ref}$ through a high-resistance branch R.

The parasitic substrate component of the coupling capacitors C1 and C2, respectively, are thereby formed by a series circuit of two parasitic capacities, namely, the barrier layer capacity between the substrate 30 and the epitaxial layer 31 on one hand, and between the epitaxial layer 31 and the high conduction zone 32 on the other hand, which are connected to the reference potential $V_{ref}$ through a high resistance. At the same time, these parasitic capacities are connected to the side of the coupling capacitors C1 and C2, facing away from the oscillator ouput, i.e., the emitters of the transistors T1 and T2. After passing the coupling capacities C1 and C2, the oscillator output signal sees a parallel circuit of the series circuit, which is understood to be a single parasitic capacity of the parasitic capacities defined above and the input capacity of the buffer stage 10. Meanwhile, a signal that might be coupled back from the mixer 11 through the substrate 30 and which could travel from the mixer 11 through the substrate 30, through the series circuit of the parasitic capacities between the substrate 30 and the epitaxial layer 31, the epitaxial layer 31 and the high-conduction zone 32 and the coupling capacities C1 and C2, respectively, to the output of the oscillator, remains sufficiently small so that it remains without influence on the oscillator frequency.

Figure 3:
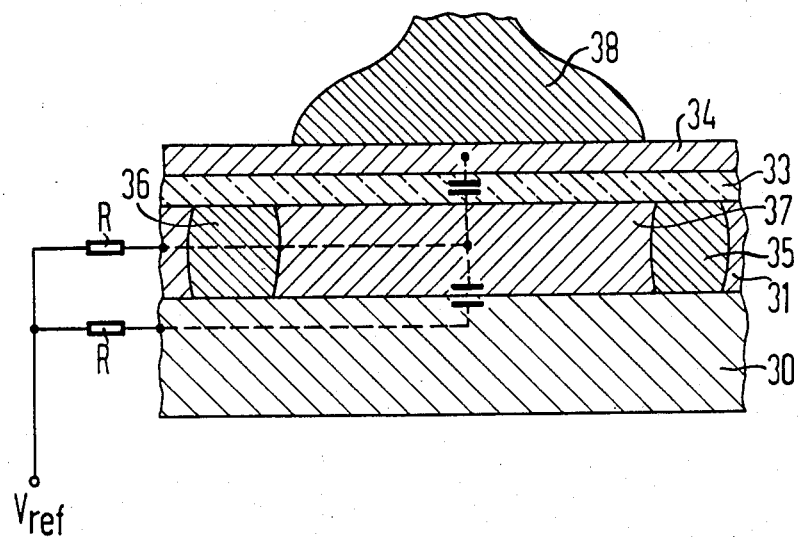
FIG. 3 is a view similar to FIG. 2 of an embodiment of output connections between an active oscillator circuit and frequency-determining passive circuits as well as output connections of the mixer.

In the other hand, since the substrate 30 and the epitaxial layer 31 are connected through the resistance R to the reference potential $V_{ref}$ at a high resistance level, possible slow charge carrier motions in these layers likewise remain without influence on the oscillator frequency. In order to eliminate parasitic signals fed back through the substrate 30 to the terminals 3, 4 and 6, 7, respectively, between the active oscillator part 1 and the frequency-determining passive circuits which could act on the oscillator frequency, the oscillator terminals 3, 4 and 6, 7, and the modulator output terminals 13 and 15, are formed by a structure shown as an embodiment in FIG. 3. Insulating diffusion zones 35 and 36 which enclose a tray 37, are disposed in an epitaxial layer 31 applied to the substrate 30. An insulating and passivating layer 33 is disposed on top of the semiconductor body. A high conduction layer 34, such as aluminum, is disposed on the layer 33. Chip terminals 38 are produced on the conducting layer 34, for instance, by thermocompression, which in turn lead to the casing terminal of the integrated circuit. The barrier layer capacity formed by the substrate 30 of one conduction type and the tray 37 of the other conduction type, in this case forms a parasitic capacity together with the MOS capacity formed between the tray 37 and the conducting layer 34. The parasitic capacity is supposed to remain without influence on the oscillator circuit as far as possible. According to the invention, the tray formed by the epitaxial layer 37 is likewise connected through the resistance R to a reference potential $V_{ref}$ at a high resistance so that a series connection of the two parasitic capacities is obtained which leads to an equivalent capacity which is considerably smaller than the barrier layer capacity or the MOS capacity. At the same time, influences on the oscillator frequency due to possible charge carrier motions in the tray 37 are avoided.

The foregoing is a description corresponding in substance to German Application No. P 34 21 278.7, dated June 7, 1984, the International priority of which is being claimed for the instant application, and which is hereby made part of this application. Any material discrepancies between the foregoing specification and the aforementioned corresponding German application are to be resolved in favor of the latter.

I claim:

1. An oscillator and mixer circuit arrangement of an integrated UHF/VHF modulator circuit, comprising a single oscillator active circuit to be connected to frequency-determining passive circuits for UHF and multichannel VHF operation, a single mixer circuit for mixing an oscillator signal from said active oscillator circuit with a signal to be mixed with the oscillator signal, and a reaction-free coupling connected between said single oscillator active circuit and said single mixer circuit.

2. A modulator circuit according to claim 1, wherein said signal to be mixed with the oscillator signal is a video signal.

3. A modulator circuit according to claim 1, wherein said signal to be mixed with the oscillator signal is an audio signal.

4. A modulator circuit according to claim 1, wherein said signal to be mixed with the oscillator signal is a video and audio signal.

5. A modulator circuit according to claim 1, wherein said active oscillator circuit has an output, said mixer circuit has an input, and said reaction-free coupling is a buffer stage having an input capacitively coupled without reaction to said output of said active oscillator circuit, and an output connected to said input of said mixer part.

6. An oscillator and mixer circuit arrangement of an integrated UHF/VHF modulator circuit, comprising a single oscillator active circuit to be connected to frequency-determining passive circuits for UHF and multichannel VHF operation, a single mixer circuit for mixing an oscillator signal from said active oscillator circuit with a signal to be mixed with the oscillator signal, and a reaction-free coupling connected between said single oscillator active circuit and said single mixer circuit; wherein said reaction-free coupling is an integrated capacity device formed of a series circuit of an MOS capacity and a barrier layer capacity.

7. A modulator circuit according to claim 6, wherein said MOS capacity is formed of a semiconductor body containing an integrated circuit, an insulating passivating layer disposed on said semiconductor body as a dielectric, and a conductor run disposed on said insulating passivating layer; and said barrier layer capacity is formed by at least one pn-junction between a doped zone disposed in said semiconductor body and said semiconductor body.

8. A modulator circuit according to claim 7, including terminals connected to said active oscillator circuit for the frequency-determining passive circuits, and output terminals connected to said mixer circuit.

9. A modulator circuit according to claim 6, including a high-resistance branch connecting said barrier layer capacity to a reference potential.

10. A modulator circuit according to claim 7, including a high-resistance branch connecting said barrier layer capacity to a reference potential.

11. An oscillator and mixer circuit arrangement of an integrated UHF/VHF modulator circuit, comprising a single oscillator active circuit to be connected to frequency-determining passive circuits for UHF and multichannel VHF operation, a single mixer circuit for mixing an oscillator signal from said active oscillator circuit with a signal to be mixed with the oscillator signal, and a reaction-free coupling connected between said single oscillator active circuit and said single mixer circuit; wherein said active oscillator circuit has an output, said mixer circuit has an input, and said reaction-free coupling is a buffer stage having an input capacitively coupled without reaction to said output of said active oscillator circuit, and an output connected to said input of said mixer part; wherein said reaction-free coupling is an integrated capacity device formed of a series circuit of an MOS capacity and a barrier layer capacity.

12. A modulator circuit according to claim 8, wherein said MOS capacity is formed of a semiconductor body containing an integrated circuit, an insulating passivating layer disposed on said semiconductor body as a dielectric, and a conductor rn disposed on said insulating passivating layer; and said barrier layer capacity is formed by at least one pn-junction between a doped zone disposed in said semiconductor body and said semiconductor body.

13. A modulator circuit according to claim 12, including terminals connected to said active oscillator circuit for the frequency-determining passive circuits, and output terminals connected to said mixer circuit.

14. A modulator circuit according to claim 11, including a high-resistance branch connecting said barrier layer capacity to a reference potential.

15. A modulator circuit according to claim 12, including a high-resistance branch connecting said barrier layer capacity to a reference potential.

* * * * *